(12) United States Patent
Kornmeyer

(10) Patent No.: US 9,228,256 B2
(45) Date of Patent: Jan. 5, 2016

(54) SUBSTRATE SUPPORT

(75) Inventor: Torsten Kornmeyer, Koenigswinter (DE)

(73) Assignee: KGT GRAPHIT TECHNOLOGIE GMBH, Windhagen (DE)

(*) Notice: Subject to any disclaimer, the term of this patent is extended or adjusted under 35 U.S.C. 154(b) by 723 days.

(21) Appl. No.: 13/515,096

(22) PCT Filed: Mar. 18, 2010

(86) PCT No.: PCT/EP2010/053516
§ 371 (c)(1),
(2), (4) Date: Jul. 16, 2012

(87) PCT Pub. No.: WO2011/069687
PCT Pub. Date: Jun. 16, 2011

(65) Prior Publication Data
US 2012/0279443 A1 Nov. 8, 2012

(30) Foreign Application Priority Data
Dec. 11, 2009 (DE) .......................... 10 2009 057 790

(51) Int. Cl.
C23C 16/458 (2006.01)
C23C 14/50 (2006.01)
H01L 21/677 (2006.01)
H01L 21/687 (2006.01)

(52) U.S. Cl.
CPC ............ C23C 14/50 (2013.01); C23C 16/4583 (2013.01); H01L 21/67754 (2013.01); H01L 21/68771 (2013.01)

(58) Field of Classification Search
CPC ............. H01L 21/68785; C23C 14/50; C23C 16/4583; C30B 25/12; C30B 31/14
USPC ................. 269/289 R, 296; 118/500
See application file for complete search history.

(56) References Cited

U.S. PATENT DOCUMENTS

| | | | | |
|---|---|---|---|---|
| 1,471,155 A | * | 10/1923 | Griffin | ................ 182/33.2 |
| 4,013,022 A | * | 3/1977 | Walter et al. | ............ 108/188 |
| 6,432,207 B1 | | 8/2002 | Fan | |
| 6,559,928 B1 | | 5/2003 | Aoki | |
| 2004/0126522 A1 | | 7/2004 | Extrand et al. | |
| 2008/0254224 A1 | | 10/2008 | Kishimoto et al. | |

FOREIGN PATENT DOCUMENTS

| | | |
|---|---|---|
| CN | 1376562 A | 10/2002 |
| DE | 202009001817 U1 | 7/2009 |
| EP | 1855324 A1 | 11/2007 |
| WO | 0220871 A1 | 3/2002 |
| WO | 02056338 A2 | 7/2002 |
| WO | 2010/085949 A2 | 8/2010 |

OTHER PUBLICATIONS

International Search Report for PCT/EP2010/053516 dated Aug. 4, 2010.
National Search Report issued for corresponding Chinese patent application No. 201080055533X dated Oct. 23, 2013.

* cited by examiner

*Primary Examiner* — Lee D Wilson
*Assistant Examiner* — Jamal Daniel
(74) *Attorney, Agent, or Firm* — Heslin Rothenberg Farley & Mesiti P.C.

(57) ABSTRACT

A substrate support for receiving substrates or wafers to be processed and for transporting said substrates or wafers in or through processing installations has universal application, is easily adaptable for specific tasks and is economical in use of material. Within a frame made of longitudinal and transverse supports, a plurality of longitudinal and transverse members are arranged intersecting in a grid-like manner, such that a base grid for directly or indirectly receiving substrates is formed. Both the longitudinal and transverse supports and the longitudinal and transverse members are positively connected to one another.

8 Claims, 2 Drawing Sheets

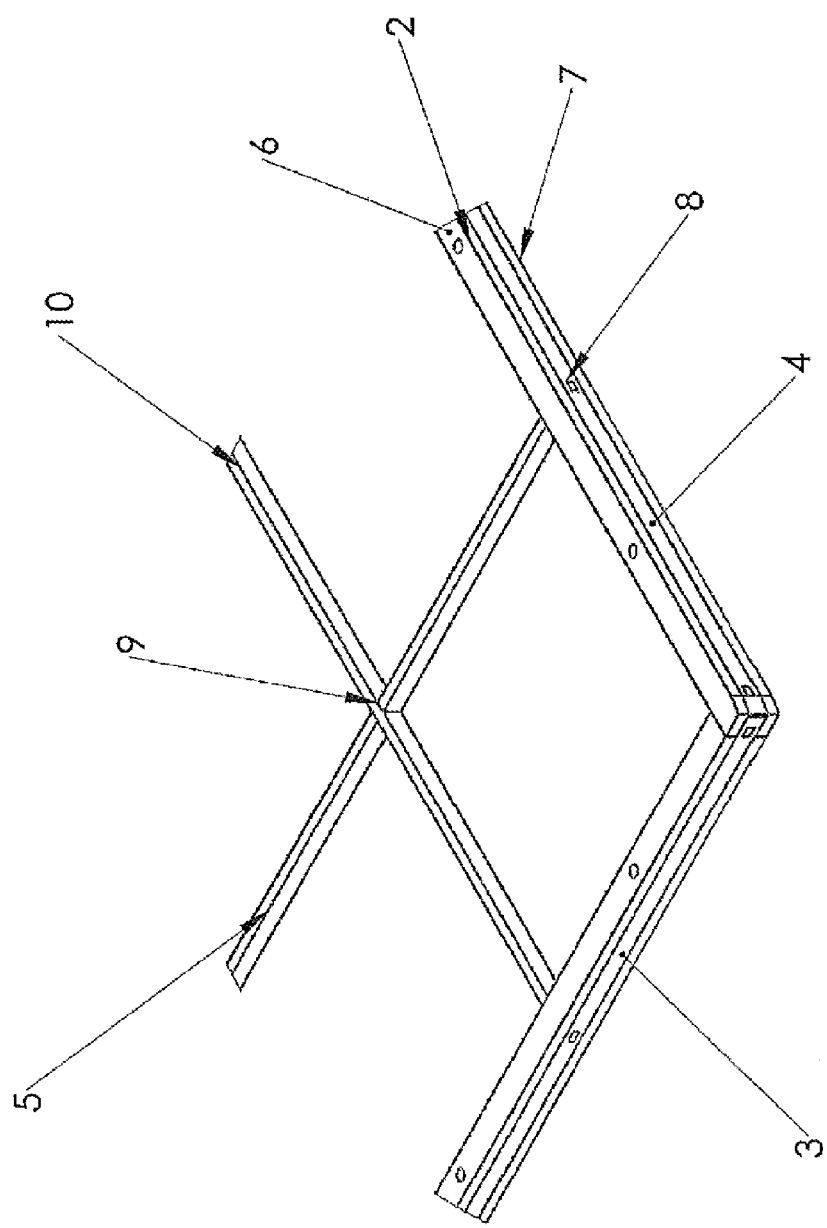

SUBSTRATE SUPPORT

CROSS REFERENCE TO RELATED APPLICATIONS

This application is a national stage filing under section 371 of International Application No. PCT/EP2010/053516 filed on Mar. 18, 2010, and published in German on Jun. 16, 2011 as WO 2011/069687 A1 and claims priority of German application No. 10 2009 057 790.4 filed on Dec. 11, 2009, the entire disclosure of these applications being hereby incorporated herein by reference.

BACKGROUND ART

The invention relates to a substrate support for holding substrates or wafers to be processed and for transporting them in or through process plants.

Substrate supports, which are also referred to as carriers or boats or plasma boats, are used in the semiconductor or photovoltaic industry for transporting substrates or wafers composed of glass, silicon or other materials in or through process plants. Such substrate supports or carriers are necessary in particular if the substrates or wafers are particularly sensitive or particularly thin with a large surface area, such that direct transport thereof, that is to say without using auxiliary means, is not possible because of the risk of damage.

The substrate supports or carriers are usually made of plates provided with additional means for holding, attaching or placing the substrates or wafers.

For example, WO 02/20871 A1 discloses a wafer support/carrier, which is made of a plate having a plurality of mutually adjacent cutouts each for horizontally holding one substrate, the cutouts having only slightly larger dimensions than the substrates. Inside the cutouts are three placement pins, on which the substrates are to be placed. Owing to this three-point placement, the maximum possible electrical contact stability is achieved, as is necessary for plasma processes, e.g. PECVD processes. The plates themselves are composed of graphite, owing to the temperature stability and the necessary electrical conductivity.

The in this case square substrates are fixed in the plane by at least partially dipping into the cutout and are thus fixed in the x and y directions. The cutouts are milled into a solid plate and permit automatic placement of the substrates or wafers.

However, the manufacture of such solid plasma boats is relatively complex due to the mechanical processing required.

A similar construction is disclosed in WO 02/056338 A2. Here, too, a substrate support with depressions, which have been incorporated with as accurate a fit as possible, is used for transporting the horizontally arranged substrates, which substrate support likewise has quite a high mass. The substrate support including the substrates positioned thereon is transported on rolls through a mass tunnel of a process plant, in which mass tunnel HF/VHF electrodes are arranged.

Other materials can of course also be used for the substrate supports, such as CFC/CFRP (carbon-fiber reinforced plastic) or a CF/ceramic matrix, that is to say a high temperature matrix, or else metal.

The use of whole crude plates results in a significant usage of materials and processing outlay and also a relatively large amount of waste. In addition, solid substrate supports are useable with little flexibility, i.e. the substrate supports are useable mostly only for a specific process. This means that a multiplicity of substrate supports must be stocked.

For this reason, substrate supports which are useable as universally as possible or are easily adaptable for concrete tasks would be desirable.

BRIEF SUMMARY OF INVENTION

The invention is then based on the object of providing a material-saving substrate support with which the disadvantages of the prior art can be avoided.

The object on which the invention is based is achieved by arranging and interconnecting a multiplicity of longitudinal and transverse members to intersect one another in the manner of a grid inside a frame formed from longitudinal and transverse supports, in a manner such that a base grid for directly or indirectly holding substrates is formed.

A substrate support of such configuration is distinguished by a particularly low-mass construction and is assemblable completely individually and adaptable to any desired conditions of use. Thus, the substrate support according to the invention can be used with little outlay to transport any desired substrates through process plants, since a corresponding adaptation is possible simply using special adapters.

In a first configuration of the invention, the longitudinal and transverse supports and also the longitudinal and transverse members are connected to one another in a form-fitting manner. In this manner, a high dimensional stability is achieved and in addition simple assembly and disassembly of the substrate support are ensured.

The form-fitting connections between the longitudinal and transverse supports and also the longitudinal and transverse members can be realized simply by way of mortise and tenon joints and/or cross-lapped joints, wherein the tenons have non-round or angular outer contours and the mortise holes have shape-congruent inner contours.

In a further development of the invention, the outer longitudinal supports are in each case composed of an upper chord and a lower chord, which are connected to each other fixedly but releasably, which can be realized particularly easily by using a screw-connection.

Furthermore, the transverse members are fixed in a form-fitting manner to the longitudinal supports between the upper chord and the lower chord, with a form-fitting attachment using mortise and tenon joints being provided herefor.

In a further configuration of the invention, the longitudinal and transverse members are provided with unipartite or multipartite holding devices for the placement and fixing of substrates. Such holding devices can be configured entirely as desired depending on the dimensions and the shape of the substrates.

In the interest of simple fixability of the holding devices, they are fixed on the longitudinal and transverse members using pins, clips or screws.

The holding devices can furthermore be attached on the substrate support using pinned-on or screw-connected decoupling pieces made of ceramics, graphite or metal in order to bring about thermal and/or electrical decoupling of the holding devices from the substrate support.

In a further development of the invention, the individual parts of the substrate support are provided with PyC (pyrolytic carbon), SiC-CVD coatings or with plasma-sprayed ceramic coatings and/or are, depending on the field of use, composed of CFC, CFRP, ISO-graphite (synthetic graphite) or another suitable material. The coating serves for avoiding particle generation and for electrical insulation.

BRIEF DESCRIPTION OF DRAWING FIGURES

The invention will be explained in more detail below with reference to an exemplary embodiment.

In the associated drawings,

FIG. 2 shows the detail X from FIG. 1.

DETAILED DESCRIPTION

Figure 1:
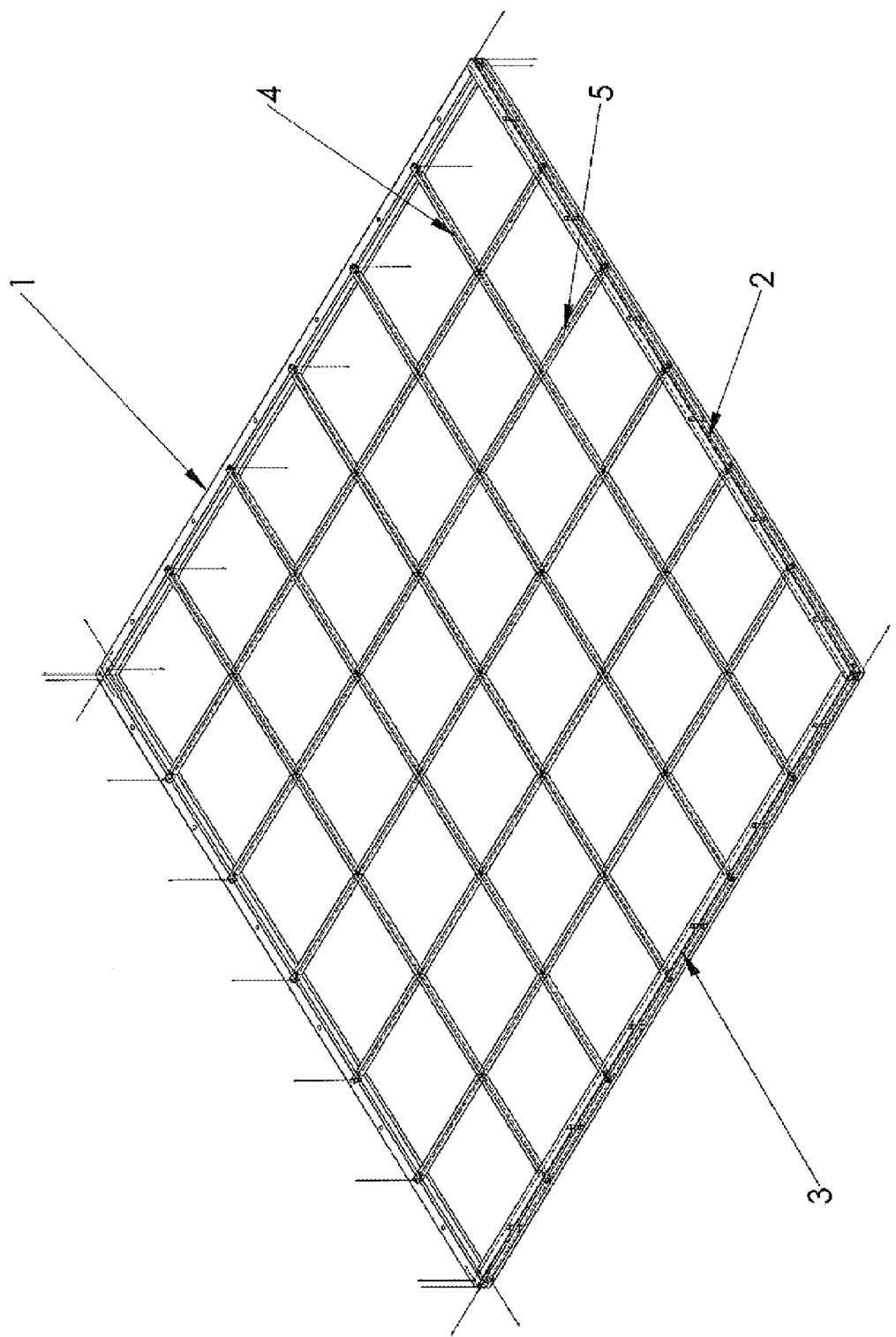
FIG. 1 shows an overview illustration of the and substrate support according to the invention.

The substrate support according to the invention is composed of a frame 1, which is bounded by longitudinal and transverse supports 2, 3, and inside the frame, a multiplicity of longitudinal and transverse members 4, 5 are arranged to intersect one another in the manner of a grid.

The outer longitudinal supports are composed in each case of an upper chord and a lower chord 6, 7, which are connected to each other. Fixed in a form-fitting manner using mortise and tenon joints 8 between the upper chord and the lower chord 6, 7 are both the transverse supports 3 and the transverse members 5. The required stability is achieved by the tenons having an at least non-round or angular outer contour and the mortise holes having a shape-congruent inner contour. As a result, it suffices to screw-connect only the upper chord and the lower chord with one another in order to bring about the required stability of the substrate support.

Furthermore, the longitudinal and transverse supports 2, 3 and the longitudinal and transverse members 4, 5 are connected to one another form-fittingly in the appropriate manner by way of mortise and tenon joints 8 and/or cross-lapped joints 9. In this manner, a high dimensional stability is achieved and in addition simple assembly and disassembly of the substrate support are ensured.

Unipartite or multipartite holding devices for the placement and fixing of any desired substrates or wafers can be arranged on the longitudinal and transverse members 4, 5. Such holding devices can be configured entirely as desired depending on the dimensions and the shape of the substrates. In FIG. 2, for example, a strut 10 is fixed on the transverse members 5.

The holding devices can be simply fixed on the longitudinal and transverse members 4,5 using pins, clips or screws.

In addition, the holding devices can be attached on the substrate support or the longitudinal and transverse members 4, 5 using decoupling pieces, which are pinned inbetween or screw-connected and are made of ceramics, graphite or metal.

The individual parts of the substrate support can be produced from CFC, CFRP or ISO-graphite and be provided with PyC, SiC-CVD coatings or with plasma-sprayed ceramic coatings in order to avoid particle generation.

A substrate support of such configuration is distinguished by a particularly low-mass construction and is completely individually adaptable to any desired conditions of use.

With the substrate support according to the invention for transporting substrates or wafers composed of glass, silicon or other materials in or through process plants, substrate supports are used in the semiconductor or photovoltaic industry which are also referred to as carriers or boats or plasma boats. Such substrate supports or carriers are necessary in particular if the substrates or wafers are particularly sensitive or particularly thin with a large surface area.

The invention claimed is:

1. A substrate support for holding substrates or wafers to be processed and for transporting them in or through process plants, comprising a frame formed from external longitudinal and transverse supports, with a multiplicity of longitudinal and transverse members arranged and interconnected to intersect one another in a grid pattern inside the frame forming a planar base grid for directly or indirectly supporting the substrates or the wafers, wherein the longitudinal and transverse members are connected to one another at an intersection in a form-fitting connection, the form-fitting connection comprising a mortise and tenon joint or a cross-lapped joint, the longitudinal supports each comprising an upper chord and a lower chord connected to each other fixedly but releasably, the transverse supports and the transverse members being fixed in a form-fitting attachment to the longitudinal supports between the upper and lower chords, the form-fitting attachment comprising a mortise and tenon joint, and a tenon of each mortise and tenon joint having at least non-round or angular outer contours and a hole of the mortise having shape-congruent inner contours.

2. The substrate support as claimed in claim 1, wherein the longitudinal and transverse members are provided with unipartite or multipartite holding devices for placement and fixing of the substrates or the wafers.

3. The substrate support as claimed in claim 2, wherein the holding devices are fixed on the longitudinal and transverse members using pins, clips or screws.

4. The substrate support as claimed in claim 2, wherein the holding devices are provided with pinned-on or screw-connected decoupling pieces made of ceramics, graphite or metal.

5. The substrate support as claimed in claim 1, wherein individual parts of the substrate support are provided with PyC, SiC-CVD coatings or with plasma-sprayed ceramic coatings and/or are composed of CFC, CFRP or ISO-graphite.

6. A substrate support for holding substrates or wafers to be processed and for transporting them in or through process plants, comprising a frame formed from longitudinal and transverse supports, and a multiplicity of longitudinal and transverse members arranged and interconnected to intersect one another inside the frame forming a base grid for directly or indirectly holding the substrates or the wafers, and wherein individual parts of the substrate support are provided with PyC, SiC-CVD coatings or with plasma-sprayed ceramic coatings and/or are composed of CFC, CFRP or ISO-graphite.

7. The substrate support as claimed in claim 1, wherein the transverse supports each comprise an upper chord and a lower chord connected to each other, and the longitudinal members are fixed to the transverse supports between the upper and lower chords by a form-fitting attachment comprising said mortise and tenon joint.

8. The substrate support as claimed in claim 1, wherein the form-fitting connection comprises a cross-lapped joint.

\* \* \* \* \*